United States Patent
Mizuta et al.

(10) Patent No.: US 6,869,742 B2
(45) Date of Patent: Mar. 22, 2005

(54) POSITIVE PHOTORESIST COMPOSITION

(75) Inventors: Jyunichi Mizuta, Kanagawa (JP);
Kouji Yonemura, Kanagawa (JP);
Akira Katano, Kanagawa (JP); Satoshi Niikura, Kanagawa (JP); Kousuke Doi, Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 0 days.

(21) Appl. No.: 10/109,899

(22) Filed: Apr. 1, 2002

(65) Prior Publication Data
US 2002/0182531 A1 Dec. 5, 2002

(30) Foreign Application Priority Data

Apr. 2, 2001 (JP) .................................. 2001-103438

(51) Int. Cl.$^7$ ................................. G03F 7/023
(52) U.S. Cl. ............... 430/190; 430/191; 430/192; 430/193
(58) Field of Search ............... 430/165, 190, 430/191, 192, 193

(56) References Cited

U.S. PATENT DOCUMENTS

| | | | | |
|---|---|---|---|---|
| 5,238,775 A | * | 8/1993 | Kajita et al. ................. | 430/192 |
| 5,380,618 A | * | 1/1995 | Kokubo et al. ............. | 430/190 |
| 5,413,896 A | * | 5/1995 | Kajita et al. ................. | 430/192 |
| 5,422,221 A | * | 6/1995 | Okazaki et al. ............. | 430/190 |
| 5,478,691 A | * | 12/1995 | Miyashita et al. .......... | 430/190 |
| 5,529,880 A | * | 6/1996 | Zampini et al. ............. | 430/190 |
| 5,639,587 A | * | 6/1997 | Sato et al. ................... | 430/190 |
| 5,695,906 A | * | 12/1997 | Nishi et al. .................. | 430/190 |
| 5,723,254 A | * | 3/1998 | Zampini et al. ............. | 430/190 |
| 5,728,504 A | * | 3/1998 | Hosoda et al. .............. | 430/192 |
| 5,932,389 A | * | 8/1999 | Zampini ...................... | 430/192 |
| 6,210,855 B1 | | 4/2001 | Ueda et al. | |
| 6,391,513 B1 | * | 5/2002 | Susukida et al. ........... | 430/190 |

FOREIGN PATENT DOCUMENTS

| | | |
|---|---|---|
| JP | 10-069077 | 3/1998 |
| JP | 11-015151 | 1/1999 |

* cited by examiner

*Primary Examiner*—John S. Chu
(74) *Attorney, Agent, or Firm*—Sughrue Mion, PLLC

(57) ABSTRACT

A positive photoresist composition includes (A) an alkali-soluble novolak resin containing 1,2-naphthoquinonediazidosulfonyl groups substituting for part of hydrogen atoms of phenolic hydroxyl groups, (B) an ester of, for example, a compound represented by the following formula with a naphthoquinonediazidosulfonyl compound, and (C) a sensitizer:

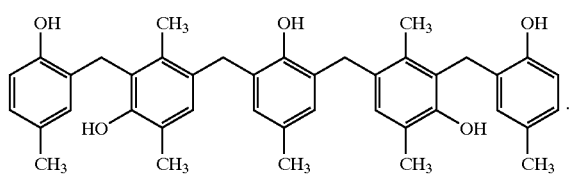

6 Claims, 1 Drawing Sheet

FIG.1

| DOF | Example 1 | Comp. Ex.2 |
|---|---|---|
| -0.8 | ※1 | ※1 |
| -0.6 |  | ※1 |
| -0.4 |  |  |
| -0.2 |  |  |
| 0 |  |  |
| +0.2 |  |  |
| +0.4 |  |  |
| +0.6 | ※1 | ※1 |

※1: No separated hole pattern was obtained.

POSITIVE PHOTORESIST COMPOSITION

BACKGROUND OF THE INVENTION

1. Field of the Invention

The present invention relates to a positive photoresist composition. Specifically, it relates to a positive photoresist composition that is suitable for the formation of very fine and dense hole patterns comprising very fine holes and having a duty ratio of less than or equal to 1. The duty ratio is expressed by [space (an interval between a hole and another)/hole diameter] and when it is less than or equal to 1, it means that the space is less than or equal to 1 when the hole diameter is defined as 1.

2. Description of the Related Art

Conventional positive photoresist compositions comprising alkali-soluble resins and quinonediazido-group-containing compounds exhibit excellent definition, sensitivity and etching resistance in photolithographic techniques using i-line (365 nm) and have practically been used in the manufacture of semiconductor devices and liquid crystal devices. However, these positive photoresist compositions cannot form satisfactory hole patterns.

With an increasing density of integrated circuits (ICs), the size and interval of patterns become finer and denser, and demands have been made on techniques to form ultrafine patterns each having a hole diameter of less than or equal to half a micron and a duty ratio of less than or equal to 1 in the formation of hole patterns.

However, when the conventional compositions are used for the formation of such ultrafine hole patterns comprising patterns very close to each other, they fail to form separated patterns due to bridge of patterns in many cases.

In addition, even if separated patterns are obtained, the resulting holes do not have satisfactorily vertical profile and have "tapered shapes" in which the diameter of the top of the holes is larger than that of the bottom thereof to thereby cause etching failure and interconnection failure. There have been demands on compositions that can form patterns having improved shapes.

Japanese Patent Application Laid-Open No. 11-15151 (reference 1) discloses a positive photoresist composition for the formation of contact holes, comprising an alkali-soluble resin and a specific naphthoquinonediazido-group-containing compound. The composition can effectively avoid dimple formation in the formation of holes using a halftone mask.

Japanese Patent Application Laid-Open No. 10-69077 (reference 2) discloses a positive photoresist composition comprising 100 parts by weight of an alkali-soluble novolak resin and 0.5 to 10 parts by weight of a specific dissolution accelerator (sensitizer) having phenolic hydroxyl groups. The alkali-soluble novolak resin has a weight average molecular weight (Mw) of 1000 to 10000 and includes 1,2-naphthoquinonediazidosulfonyl groups substituting for 2% to 27% by mole of total hydroxyl groups. The composition can exhibit high definition in the formation of line and space (L & S).

Japanese Patent Application Laid-Open No. 10-97066 (reference 3) discloses a positive photoresist composition comprising a novolak resin and a specific dissolution accelerator (sensitizer) having phenolic hydroxyl groups. The novolak resin has a weight average molecular weight (Mw) of 1000 to 10000 and includes 1,2-naphthoquinonediazidosulfonyl groups substituting for 2% to 27% by mole of total hydroxyl groups. The composition can form "microgrooves", i.e., resist patterns having constricted bottoms, and is suitable as a material for lift-off technique. These conventional positive photoresist compositions, however, exhibit insufficiently high definition in the formation of hole patterns having a duty ratio of less than or equal to 1.

SUMMARY OF THE INVENTION

Accordingly, an object of the present invention is to provide a positive photoresist composition that can exhibit excellent sensitivity, definition and focal depth range properties (DOF properties), can form ultrafine separated patterns each having a hole diameter of less than or equal to 0.5 μm and a duty ratio of less than or equal to 1 without bridge of patterns and can form hole patterns with satisfactorily vertical profile in the formation of hole patterns.

After intensive investigations to achieve the above objects, the present invention has been accomplished.

Specifically, the present invention provides, in an aspect, a positive photoresist composition which includes (A) an alkali-soluble novolak resin including 1,2-naphthoquinonediazidosulfonyl groups substituting for part of hydrogen atoms of phenolic hydroxyl group, (B) an ester of at least one selected from compounds represented by following Formula (I) with a naphthoquinonediazidosulfonyl compound, and (C) a sensitizer (intensifier):

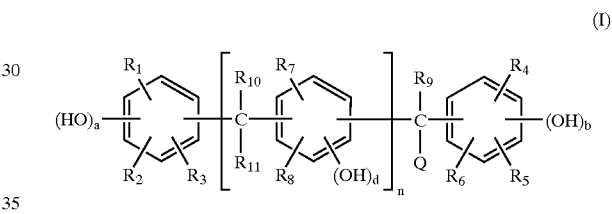

wherein $R^1$, $R^2$, $R^3$, $R^4$, $R^5$, $R^6$, $R^7$ and $R^8$ are each independently a hydrogen atom, a halogen atom, an alkyl group having from 1 to 6 carbon atoms, an alkoxyl group having from 1 to 6 carbon atoms or a cycloalkyl group; $R^9$, $R^{10}$ and $R^{11}$ are each independently a hydrogen atom or an alkyl group having from 1 to 6 carbon atoms; Q is a hydrogen atom or an alkyl group having from 1 to 6 carbon atoms or Q is combined with $R^9$ to form a cycloalkyl ring having 3 to 6 carbon atom members or a residue represented by following Formula (II); a and b each independently denote an integer from 1 to 3; d denotes an integer from 0 to 3; and n denotes an integer from 0 to 3:

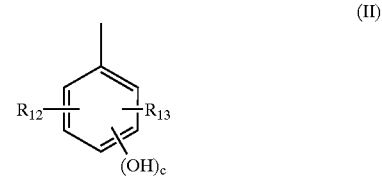

wherein $R^{12}$ and $R^{13}$ are each independently a hydrogen atom, a halogen atom, an alkyl group having from 1 to 6 carbon atoms, an alkoxyl group having from 1 to 6 carbon atoms or a cycloalkyl group; and c denotes an integer from 1 to 3.

The ingredient (A) may have a weight average molecular weight (Mw) in terms of polystyrene of from 4000 to 5000 and a molecular weight distribution (Mw/Mn) of less than or equal to 3.0, where Mn is a number average molecular weight.

The ingredient (A) is preferably an alkali-soluble novolak resin synthetically prepared from m-cresol, p-cresol and 2,3,5-trimethylphenol.

The ingredient (B) is preferably an ester of at least one selected from compounds represented by following Formula (III) and compounds represented by following Formula (IV) with a naphthoquinonediazidosulfonyl compound:

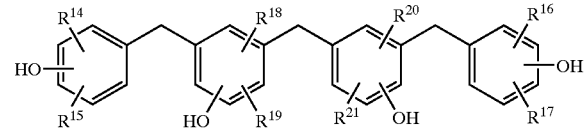

(III)

wherein $R^{14}$, $R^{15}$, $R^{16}$, $R^{17}$, $R^{18}$, $R^{19}$, $R^{20}$ and $R^{21}$ are each independently a hydrogen atom or an alkyl group having from 1 to 3 carbon atoms, and

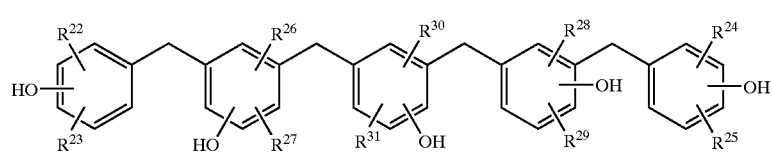

(IV)

wherein $R^{22}$, $R^{23}$, $R^{24}$, $R^{25}$, $R^{26}$, $R^{27}$, $R^{28}$, $R^{29}$, $R^{30}$ and $R^{31}$ are each independently a hydrogen atom, an alkyl group having from 1 to 3 carbon atoms or a cyclohexyl group.

The ingredient (C) may be at least one selected from compounds represented by following Formula (V):

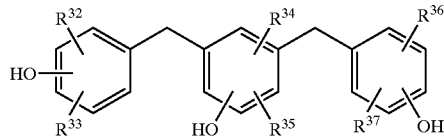

(V)

wherein $R^{32}$, $R^{33}$, $R^{34}$, $R^{35}$, $R^{36}$ and $R^{37}$ are each independently a hydrogen atom or an alkyl group having from 1 to 3 carbon atoms.

The proportion of the ingredient (C) preferably ranges from 1 to 40 parts by weight relative to 100 parts by weight of the ingredient (A).

Preferably, the proportion of the ingredient (B) ranges from 0.5 to 20 parts by weight relative to 100 parts by weight of the total weight of the ingredients (A) and (C).

The positive photoresist composition of the present invention can exhibit excellent sensitivity, definition and focal depth range properties (DOF properties), can form ultrafine separated patterns each having a hole diameter of less than or equal to 0.5 μm and a duty ratio of less than or equal to 1 without bridge of patterns and can form hole patterns with satisfactorily vertical profile in the formation of hole patterns.

BRIEF DESCRIPTION OF THE DRAWINGS

FIG. 1 is a diagram showing DOF properties of a positive photoresist composition according to Example 1 as compared with a positive photoresist composition according to Comparative Example 2.

DESCRIPTION OF THE PREFERRED EMBODIMENTS

Ingredient (A)

Alkali-soluble novolak resins for use as the ingredient (A) in the present invention are not specifically limited, as long as they are alkali-soluble novolak resins in which 1,2-naphthoquinonediazidosulfonyl groups substitute for part of hydrogen atoms of phenolic hydroxyl groups. Such resins can synthetically be obtained by subjecting a phenol compound and a condensing agent to dehydration condensation and esterifying the resulting polycondensation product with a 1,2-naphthoquinonediazidosulfonyl compound according to a conventional procedure as described in, for example, Japanese Patent Application Laid-Open No. 10-69077 and No. 10-97066.

Such 1,2-naphthoquinonediazidosulfonyl compounds for use herein include halides of quinonediazide compounds, such as 1,2-naphthoquinonediazido-4-sulfonyl chloride and 1,2-naphthoquinonediazido-5-sulfonyl chloride.

As the phenol compound, m-cresol, p-cresol and 2,3,5-trimethylphenol are preferably used in combination, and phenol novolak resins synthetically obtained using these compounds as materials are advantageously used in the present invention.

The condensing agent includes, for example, aldehydes and ketones conventionally used for the preparation of phenol novolak resins. Among them, aldehydes are preferred, of which formaldehyde is typically preferred.

Low molecular weight fractions of the polycondensation product prepared by polycondensation of the phenol compound with the condensing agent are preferably removed according to a conventional fractionation procedure. The resulting novolak resin should preferably have a weight average molecular weight (Mw) in terms of polystyrene of from 4000 to 5000 and a molecular weight distribution (Mw/Mn) of less than or equal to about 3.0, where Mn is a number average molecular weight.

If Mw is less than 4000, the formed hole pattern may have a broadened top and may have an insufficiently vertical profile. In addition, films of unexposed portions may be reduced upon development to thereby deteriorate definition and heat resistance. If it exceeds 5000, the formed hole pattern may have an insufficiently vertical profile and may exhibit deteriorated definition and sensitivity. The novolak resin should typically preferably have a Mw of from 4100 to 4500.

If the molecular weight distribution (Mw/Mn) exceeds 3.0, the formed hole pattern may have a broadened top, may exhibit deteriorated definition and may have an insufficiently vertical profile. This phenomenon occurs specifically when the focus is shifted to the plus side during exposure, i.e., when the focus is shifted to the bottom side of the resist film, resulting in deteriorated focal depth range properties. The novolak resin should typically preferably have a molecular weight distribution (Mw/Mn) of from 2.2 to 2.8.

The polycondensation product should preferably contain less than or equal to 1% by weight of phenolic monomers and less than or equal to 4% by weight of phenolic dimers as a result of the fractionation procedure.

If the contents of the phenolic monomers and dimers exceed the above ranges, the hole pattern may have an insufficiently vertical profile and may exhibit deteriorated heat resistance, and scum may be remained on the substrate after development.

The contents of the phenolic monomers and dimers can be determined by gel permeation chromatography (GPC).

Specifically, a GPC chart reveals the molecular weight distribution of the resulting phenol novolak resin, and based on this, the contents of the monomers and dimers can be calculated by determining the intensity ratio between peaks corresponding to the elution times of the phenolic monomers and dimers, respectively.

The elution times of the phenolic monomers and dimers vary depending on the measuring means, and it is important to specify the measuring conditions such as column, eluent, flow rate, temperature, detector, sample concentration, injection amount of the sample and measuring system.

In the present invention, the elution times of such phenolic monomers and dimers can attribute to about 23 to about 25 minutes and to about 21 to about 22 minutes, respectively, according to the following measuring means.

GPC Measurement in the Present Invention (1) A total of 20 mg of a sample is dissolved in 10 ml of tetrahydrofuran (THF) to yield a sample solution.

(2) A total of 10 μl of the above-prepared sample solution is injected into the following GPC measuring system and is allowed to flow for 28 minutes to thereby determine the elution time of the sample detected at an UV wavelength λ of about 280 nm.

Measuring System

As the measuring system, a GPC measuring system (manufactured by Showa Denko K.K. under the trade name of GPC SYSTEM 11) is used. The measuring system includes a guard column (manufactured by Showa Denko K.K. under the trade name of KF-G) and three separation columns (manufactured by Showa Denko K.K. under the trade name of KF-801, having a size of 8 μm in diameter and 300 mm in length and comprising a styrene-divinylbenzene copolymer having a particle size of 6 μm as a stationary phase). The temperature of the separation column is set at 40° C. using an oven. The eluent tetrahydrofuran (THF) is supplied at a rate of 1.0 ml/min.

In the formation of dense hole patterns, A-parameter must be decreased to thereby increase the transmittance of the resulting photosensitive film. However, if A-parameter is decreased, hole patterns with high contrast cannot significantly be obtained in conventional techniques.

According to the present invention, the use of the ingredient (A) can yield high-contrast hole patterns having satisfactorily vertical profiles even if A-parameter is low. A-parameter is represented according to the following equation, and a low A-parameter means that the photosensitive resin film before exposure has high transparency to rays for use in exposure and that the rays reach the core of the film.

$$A = (1/d) \times \ln T\infty/T°$$

In the equation, d is the thickness of a sample, T∞=(the transmittance after ultraviolet irradiation)/100, and T°=(the transmittance before ultraviolet irradiation)/100.

Among such alkali-soluble novolak resins, those having a Mw of from 4000 to 5000 and a molecular weight distribution (Mw/Mn) of less than or equal to 3.0 and being prepared from m-cresol, p-cresol and 2,3,5-trimethylphenol as materials are preferred, as they can yield high-contrast hole patterns having satisfactorily vertical profiles.

In the ingredient (A), 1,2-naphthoquinonediazidosulfonyl group may preferably substitute for 3.0% to 5.0% by mole of hydrogen atoms of phenolic hydroxyl groups. If the 1,2-naphthoquinonediazidosulfonyl groups substitute for less than 3.0% by mole of the hydrogen atoms, the resulting hole pattern may have a broadened top, and the films of unexposed portions may be reduced. If they substitute for more than 5.0% by mole of the hydrogen atoms, the resulting composition may have deteriorated definition, the hole pattern may have a broadened top to thereby have an insufficiently vertical profile, and the composition may have deteriorated sensitivity.

Ingredient (B)

Compounds for use as the ingredient (B) in the present invention are esters (quinonediazide esters) of at least one selected from the compounds represented by Formula (I) with a naphthoquinonediazidosulfonyl compound. Preferred examples of the compounds represented by Formula (I) to constitute such quinonediazide esters include 2,4-bis(3,5-dimethyl-4-hydroxybenzyl)-5-hydroxyphenol, 2,6-bis(2,5-dimethyl-4-hydroxybenzyl)-4-methylphenol and other linear trinuclear compounds; bis[2,5-dimethyl-3-(2-hydroxy-5-methylbenzyl)-4-hydroxyphenyl]methane, bis[2,5-dimethyl-3-(4-hydroxy-5-methylbenzyl)-4-hydroxyphenyl]methane, bis [2,5-dimethyl-3-(4-hydroxybenzyl)-4-hydroxyphenyl]methane, bis[3-(3,5-dimethyl-4-hydroxybenzyl)-4-hydroxy-5-methylphenyl]methane, bis[3-(3,5-dimethyl-4-hydroxybenzyl)-4-hydroxy-5-ethylphenyl]methane, bis[3-(3,5-diethyl-4-hydroxybenzyl)-4-hydroxy-5-methylphenyl]methane, bis[3-(3,5-diethyl-4-hydroxybenzyl)-4-hydroxy-5-ethylphenyl]methane, bis[2-hydroxy-3-(3,5-dimethyl-4-hydroxybenzyl)-5-methylphenyl]methane, bis[2-hydroxy-3-(2-hydroxy-5-methylbenzyl)-5-methylphenyl]methane, bis[4-hydroxy-3-(2-hydroxy-5-methylbenzyl)-5-methylphenyl]methane and other linear tetranuclear compounds; 2,6-bis[2,5-dimethyl-3-(2-hydroxy-5-methylbenzyl)-4-hydroxybenzyl]-4-methylphenol, 2,4-bis[2-hydroxy-3-(4-hydroxybenzyl)-5-methylbenzyl]-6-cyclohexylphenol, 2,4-bis[4-hydroxy-3-(4-hydroxybenzyl)-5-methylbenzyl]-6-cyclohexylphenol and other linear pentanuclear compounds; and other linear polyphenol compounds; tris(4-hydroxyphenyl)methane, bis(4-hydroxy-3,5-dimethylphenyl)-4-hydroxyphenylmethane, bis(4-hydroxy-3,5-dimethylphenyl)-3-hydroxyphenylmethane, bis(4-hydroxy-3,5-dimethylphenyl)-2-hydroxyphenylmethane, bis(4-hydroxy-2,5-dimethylphenyl)-4-hydroxyphenylmethane, bis(4-hydroxy-2,5-dimethylphenyl)-3-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3,5-diethylphenyl)-2,4-dihydroxyphenylmethane, bis (4-hydroxy-2,5-dimethylphenyl)-2,4-dihydroxyphenylmethane, bis(4-hydroxyphenyl)-3-methoxy-4-hydroxyphenylmethane, bis(3-cyclohexyl-4-hydroxyphenyl)-3-hydroxyphenylmethane, bis(3-cyclohexyl-4-hydroxyphenyl)-2-hydroxyphenylmethane, bis(3-cyclohexyl-4-hydroxyphenyl)-4-hydroxyphenylmethane, bis(3-cyclohexyl-4-hydroxy-6-methylphenyl)-2-hydroxyphenylmethane, bis(3-cyclohexyl-4-hydroxy-6-methylphenyl)-3-hydroxyphenylmethane, bis (3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, bis(3-cyclohexyl-6-hydroxyphenyl)-3-hydroxyphenylmethane, bis(3-cyclohexyl-6-hydroxyphenyl)-4-hydroxyphenylmethane, bis(3-cyclohexyl-6-hydroxyphenyl)-2-hydroxyphenylmethane, bis(3-cyclohexyl-6-hydroxy-4-methylphenyl)-2-hydroxyphenylmethane, bis(3-cyclohexyl-6-hydroxy-4-methylphenyl)-4-hydroxyphenylmethane, bis(3-cyclohexyl-6-hydroxy-4-methylphenyl)-3,4-dihydroxyphenylmethane, bis(4-hydroxy-2,3,5-trimethylphenyl)-2-hydroxyphenylmethane, bis(4-hydroxy-2,3,5-trimethylphenyl)-3-hydroxyphenylmethane, bis(4-hydroxy-2,3,5-trimethylphenyl)-4-hydroxyphenylmethane, bis(4-hydroxy-2,3,5-trimethylphenyl)-3,4-dihydroxyphenylmethane, bis(4-hydroxy-2,3,5-trimethylphenyl)-4-hydroxy-3-methoxyphenylmethane and other trisphenolic polyphenol compounds.

By using the ingredient (B), the composition of the present invention can exhibit high definition and excellent focal depth range properties (DOF properties).

Among these ingredients (B), esters (quinonediazide esters) of at least one selected from the compounds represented by Formulae (III) and (IV) with a naphthoquinonediazidosulfonyl compound can yield hole patterns having good shapes in addition to high definition and wide DOF properties.

The average esterification rate of the quinonediazide ester of the compound represented by Formula (I) is not specifically limited. For example, the average esterification rate of the quinonediazide ester of the compound represented by Formula (III) is preferably from 20% to 80% and more preferably from 30% to 70%. If the average esterification rate is less than 20%, the resulting photoresist composition may exhibit deteriorated film residual rate and definition, and in contrast, if it exceeds 80%, the photoresist composition may exhibit deteriorated sensitivity and increased scum.

The average esterification rate of the quinonediazide ester of the compound represented by Formula (IV) is preferably from 10% to 70% and more preferably from 20% to 60%. If the average esterification rate is less than 10%, the resulting photoresist composition may exhibit deteriorated film residual rate and definition, and in contrast, if it exceeds 70%, the photoresist composition may exhibit deteriorated sensitivity and increased scum.

The positive photoresist composition may further include additional esters (naphthoquinonediazidosulfonyl-group-containing compounds), in addition to the ingredient (B). In this case, the content of the additional esters is preferably less than or equal to 50% by weight and more preferably less than or equal to 10% by weight based on the total weight of the ingredient (B) to yield the aforementioned advantages.

The proportion of the ingredient (B) in the composition of the present invention is preferably from 0.5 to 20 parts by weight and more preferably from 1 to 10 parts by weight relative to 100 parts by weight of the total weight of the ingredient (A) alkali-soluble novolak resin and the ingredient (C) sensitizer. If the proportion of the ingredient (B) is less than 0.5 parts by weight, the composition may have deteriorated DOF properties. If it exceeds 20 parts by weight, the composition may have deteriorated definition.

Ingredient (C)

Sensitizers (intensifiers) for use as the ingredient (C) in the present invention are not specifically limited and include conventional sensitizers such as the compounds represented by Formula (I). Preferred examples of such compounds include bis(4-hydroxy-2,3,5-trimethylphenyl)-2-hydroxyphenylmethane, 1,4-bis[1-(3,5-dimethyl-4-hydroxyphenyl)isopropyl]benzene, 2,4-bis(3,5-dimethyl-4-hydroxyphenylmethyl)-6-methylphenol, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, 1-[1-(4-hydroxyphenyl)isopropyl]-4-[1,1-bis(4-hydroxyphenyl)ethyl]benzene, 1-[1-(3-methyl-4-hydroxyphenyl)isopropyl]-4-[1,1-bis(3-methyl-4-hydroxyphenyl)ethyl]benzene, 2,6-bis[1-(2,4-dihydroxyphenyl)isopropyl]-4-methylphenol, 4,6-bis[1-(4-hydroxyphenyl)isopropyl]resorcin, 4,6-bis(3,5-dimethoxy-4-hydroxyphenylmethyl)pyrogallol, 4,6-bis(3,5-dimethyl-4-hydroxyphenylmethyl)pyrogallol, 2,6-bis(2,5-dimethyl-4-hydroxyphenylmethyl)-4-methylphenol, 2,6-bis(3-methyl-4,6-dihydroxyphenylmethyl)-4-methylphenol, 2,6-bis(2,3,4-trihydroxyphenylmethyl)-4-methylphenol and 1,1-bis(4-hydroxyphenyl)cyclohexane.

By using the ingredient (C), the composition of the present invention can yield hole patterns having satisfactorily vertical profiles with high sensitivity.

To yield hole patterns having further satisfactorily vertical profiles, at least one of the compounds represented by Formula (V) is preferably used as the ingredient (C), of which 2,6-bis(2,5-dimethyl-4-hydroxyphenylmethyl)-4-methylphenol is typically preferred.

The proportion of the ingredient (C) in the composition of the present invention is preferably from 1 to 40 parts by weight and more preferably from 20 to 35 parts by weight relative to 100 parts by weight of the alkali-soluble novolak resin (A). Within this range, the composition may have further improved exposure margin, definition and DOF properties and higher sensitivity.

Additives

Where necessary, the composition of the present invention may further comprise any of compatible additives including, for example, ultraviolet absorbents for inhibition of halation and surfactants for prevention of striation within ranges not adversely affecting the objects of the invention. Such ultraviolet absorbents include, for example, 2,2'4,4'-tetrahydroxybenzophenone, 4-dimethylamino-2',4'-dihydroxybenzophenone, 5-amino-3-methyl-1-phenyl-4-(4-hydroxyphenylazo)pyrazole, 4-dimethylamino-4'-hydroxyazobenzene, 4-diethylamino-4'-ethoxyazobenzene, 4-diethylaminoazobenzene and curcumin. The surfactants include, but are not limited to, Fluorade FC-430 and FC-431 (trade names, available from Sumitomo 3M Co.), EFTOP EF122A, EF122B, EF122C and EF126 (trade names, available from Tohkem Products Corporation) and other fluorine-containing surfactants.

The positive photoresist composition of the present invention is preferably used as a solution prepared by dissolving each of the ingredients (A), (B) and (C) and other additional ingredients in an appropriate solvent. Such solvents include those conventionally used in positive photoresist compositions, such as acetone, methyl ethyl ketone, cyclohexanone, methyl isoamyl ketone, 2-heptanone and other ketones; ethylene glycol, propylene glycol, diethylene glycol, ethylene glycol monoacetate, propylene glycol monoacetate, diethylene glycol monoacetate, or monomethyl ethers, monoethyl ethers, monopropyl ethers, monobutyl ethers or monophenyl ethers thereof, and other polyhydric alcohols and derivatives thereof; dioxane and other cyclic ethers; and ethyl lactate, methyl acetate, ethyl acetate, butyl acetate, methyl pyruvate, ethyl pyruvate, methyl methoxypropionate, ethyl ethoxypropionate and other esters. Each of these solvents can be used alone or in combination. Of these solvents, typically preferred solvents are acetone, methyl ethyl ketone, cyclohexanone, methyl isoamyl ketone, 2-heptanone and other ketones; and ethyl lactate, methyl acetate, ethyl acetate, butyl acetate, methyl pyruvate, ethyl pyruvate, methyl methoxypropionate, ethyl ethoxypropionate and other esters.

Practically, the positive photoresist composition of the present invention may preferably be used, for example, in the following manner: Each of the ingredients (A), (B) and (C) and other ingredients added according to necessity is dissolved in an appropriate solvent as mentioned above to yield a coating solution; the coating solution is then applied, using a spinner or the like, onto a substrate such as a silicon wafer or a substrate carrying an anti-reflection coating formed thereon, and is then dried to form a photosensitive layer; next, the photosensitive layer is exposed with an ultraviolet ray source such as a low-pressure mercury lamp, a high-pressure mercury lamp, an ultra-high-pressure mercury lamp, an arc lamp or a xenon lamp, through a desired mask pattern, or irradiated with a scanning electron beam; and the exposed portions of the film are then dissolved and removed by dipping the substrate in a developer solution, for example, an alkaline aqueous solution such as a 1% to 10% by weight tetramethylammonium hydroxide (TMAH) aqueous solution, thus forming an image being in exact accordance with the mask pattern.

EXAMPLES

The present invention will be further illustrated in detail with reference to several examples and comparative examples below which are not intended to limit the scope of the invention.

The properties of the resulting positive photoresist compositions were determined according to the following methods, and the results are shown in Table 2.

(1) Sensitivity

A sample was applied onto a silicon wafer carrying an antireflection film (available from Tokyo Ohka Kogyo Co., Ltd. under the trade name of SWK-T5 D60) using a spinner and was dried on a hot plate at 90° C. for 90 sec. to form a resist film 0.84 $\mu$m thick. The resist film was then irradiated with light through a halftone mask corresponding to a hole diameter of 0.34 $\mu$m and having a duty ratio of 0.8 and a pitch (an interval between the centers of the individual holes) of 0.61 $\mu$m for an increasing period from 0.5 sec. at intervals of 0.03 sec. using a reducing-type projection aligner NSR-2205i 14E (available from Nikon Corporation, Japan; NA=0.57, $\delta$=0.44). The film was then post-exposure baked (PEB) at 110° C. for 90 sec.; was subjected to developing in a 2.38% by weight tetramethylammonium hydroxide aqueous solution at 23° C. for 60 sec., was rinsed with water for 30 sec. and was dried.

In this procedure, the sensitivity was defined as the exposure time period (Eop) in milliseconds (ms) to reproduce a hole pattern having a diameter of 0.32 $\mu$m at its bottom.

(2) Definition

The surfaces of the hole patterns obtained in the sensitivity test at the exposure time period Eop were observed using a scanning electron microscope (SEM). Based on the observation, the definition of the sample was determined according to the following criteria:

Good: The hole patterns were formed in exact accordance with the mask dimensions without increased hole diameter.

Fair: Separated hole patterns were formed, although the hole diameter was increased.

Poor: The resulting hole patterns had increased diameters and were bridged with one another to thereby fail to form hole patterns in exact accordance with the mask dimensions.

(3) Sectional Shape (Profile)

The cross sections of the hole patterns obtained in the sensitivity test at the exposure time period Eop were observed using a scanning electron microscope (SEM) to determine the sectional shapes (profiles) of the hole patterns according to the following criteria:

Good: The sizes of the bottom and top of the hole were nearly equal to each other, and the hole had a satisfactorily vertical profile.

Poor: The size of the top of the hole was much larger than that of the bottom of the hole, thus exhibiting a tapered shape.

(4) Focal Depth Range Properties (DOF Properties)

A sample was subjected to exposure and development in a similar manner as in the test (1) at an exposure of Eop as a standard exposure, where the focus was shifted up and down at this exposure. The obtained contact hole patterns were subjected to a scanning electron microscope (SEM) photographic observation. Based upon the SEM photograph, the focal depth range (DOF) was defined as the maximum value (am) of the focal shift (defocus) to reproduce separated contact hole patterns.

SYNTHESIS EXAMPLE

Synthesis of Novolak Resin

1. Control of Molecular Weight (Mw) and Molecular Weight Distribution (Mw/Mn) by Fractionation Procedure A polycondensation product was obtained by dehydration condensation reaction of m-cresol, p-cresol and 2,3,5-trimethylphenol (molar ratio=35:40:25) with formaldehyde. A total of 125 g of the polycondensation product was placed in a 2-liter beaker and was dissolved in 920 g of methanol using a stirrer.

Next, 313 g of pure water was added to the solution to thereby form a precipitate, the precipitate was taken out from the beaker and thereby yielded a polycondensation product (x) having controlled molecular weight and molecular weight distribution (Mw=4200, Mw/Mn=2.3).

The polycondensation product contained 0.49% by weight of phenolic monomers and 2.72% by weight of dimers as determined by GPC analysis.

In this procedure, GPC analysis was performed using the following systems under following conditions.

GPC Measuring Method for Mw and Mw/Mn Determination (1) A total of 20 mg of a sample was dissolved in 10 ml of tetrahydrofuran (THF) to yield a sample solution.

(2) A total of 20 $\mu$l of the above-prepared sample solution was injected into the following GPC measuring system and was allowed to flow for 35 minutes to thereby determine the elution time of the sample detected at an UV wavelength $\lambda$ of about 280 nm.

Measuring System

As the measuring system, a GPC measuring system (manufactured by Showa Denko K.K. under the trade name of GPC SYSTEM 11) was used. The measuring system included a guard column (manufactured by Showa Denko K.K. under the trade name of KF-G) and three separation columns (manufactured by Showa Denko K.K. under the trade name of KF-805s, having a size of 8 $\mu$m in diameter and 300 mm in length and comprising a styrene-divinylbenzene copolymer having a particle size of 6 $\mu$m as a stationary phase). The temperature of the separation column was set at 35° C. using an oven. The eluent tetrahydrofuran (THF) was supplied at a rate of 1.0 ml/min.

GPC Measuring Method for the measurement of amounts of phenolic monomers and dimers (1) A total of 20 mg of a sample is dissolved in 10 ml of tetrahydrofuran (THF) to yield a sample solution.

(2) A total of 10 $\mu$l of the above-prepared sample solution is injected into the following GPC measuring system and is allowed to flow for 28 minutes to thereby determine the elution time of the sample detected at an UV wavelength λ of about 280 nm.

Measuring System

As the measuring system, a GPC measuring system (manufactured by Showa Denko K.K. under the trade name of GPC SYSTEM 11) is used. The measuring system includes a guard column (manufactured by Showa Denko K.K. under the trade name of KF-G) and three separation columns (manufactured by Showa Denko K.K. under the trade name of KF-801, having a size of 8 μm in diameter and 300 mm in length and comprising a styrene-divinylbenzene copolymer having a particle size of 6 μm as a stationary phase). The temperature of the separation column is set at 40° C. using an oven. The eluent tetrahydrofuran (THF) is supplied at a rate of 1.0 ml/min.

2. Substitution Reaction

In a 1-litter three-neck flask equipped with a thermometer, a stirrer and a dropping funnel, 50 g of the above-prepared polycondensation product (x) and 4 g (0.015 mol) of 1,2-naphthoquinonediazido-5-sulfonyl chloride were placed and were dissolved in 162 g of dioxane. A total of 3.0 g (0.030 mol) of triethylamine was added from the dropping funnel to the resulting mixture and was stirred at room temperature for 2 hours.

The mixture was then mixed with 4.7 g (0.045 mol) of a 35% hydrochloric acid, was further stirred at room temperature for 30 minutes, was separated by filtration and thereby yielded a reddish brown liquid.

The liquid was then added to 1 litter of pure water in a 2-litter beaker with stirring and thereby yielded a precipitate.

The precipitate was separated by filtration, the resulting solid matter was dissolved in butyl acetate, the resulting solution was concentrated, was mixed with ethyl lactate and thereby yielded a solution containing 30% by weight an alkali-soluble novolak resin (a1) in a solvent mixture of butyl acetate and ethyl lactate (mixing ratio of 2:8). In the alkali-soluble novolak resin (a1), 1,2-naphthoquinonediazidosulfonyl groups substituted for 3.8% by mole of hydrogen atoms of phenolic hydroxyl groups.

Example 1

Ingredient (A) (alkali-soluble novolak resin): The novolak resin a1 prepared in Synthesis Example as the solution Ingredient (B) (quinonediazide ester): The following compound b1

Ingredient (C) (sensitizer): The following compound c1

In 270 parts by weight of a solvent mixture of ethyl lactate and butyl acetate (mixing ratio of 9:1), 100 parts by weight of the ingredient (A) (corresponding to 340 g of the solution), 3.9 parts by weight of the ingredient (B) and 30 parts by weight of the ingredient (C) were dissolved, the resulting mixture was filtrated through a membrane filter having a pore size of 0.1 to 0.2 μm and thereby yielded a positive photoresist composition.

Examples 2 to 8 and Comparative Examples 1 to 3

A series of positive photoresist compositions were prepared in the same manner as in Example 1, except that the ingredients (A), (B) and (C) indicated in Table 1 were used respectively.

TABLE 1

|  | Ingredient (A) (parts by weight) | Ingredient (B) (parts by weight) | Ingredient (C) (parts by weight) |
| --- | --- | --- | --- |
| Example 1 | a1 (100) | b1 (3.9) | c1 (30) |
| Example 2 | a1 (100) | b2 (3.9) | c1 (30) |
| Example 3 | a1 (100) | b2/b3 (3.9/1.3) | c1 (30) |
| Example 4 | a1 (100) | b1 (1) | c1 (30) |
| Example 5 | a1 (100) | b1 (5) | c1 (30) |
| Example 6 | a1 (100) | b1 (3.9) | c1/c2 (15/15) |
| Example 7 | a1 (100) | b1 (3.9) | c1 (25) |
| Example 8 | a1 (100) | b1 (3.9) | c1 (35) |
| Com. Ex. 1 | a1 (100) | — | c1 (30) |
| Com. Ex. 2 | a1 (100) | b1 (3.9) | — |
| Com. Ex. 3 | x (100) | b1 (3.9) | c1 (30) | a1: The alkali-soluble novolak resin prepared in Synthesis Example x: The polycondensation product (x) prepared in Synthesis Example b1: An ester of 1 mole a compound represented by following Formula (IV-b) with 2 moles of 1,2-naphthoquinonediazido-5-sulfonyl chloride (average esterification rate: 40%):

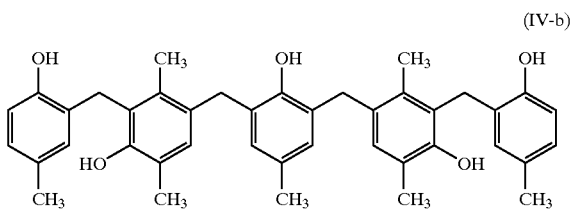

(IV-b)

b2: An ester of 1 mole a compound represented by following Formula (III-b) with 2 moles of 1,2-naphthoquinonediazido-5-sulfonyl chloride (average esterification rate: 50%):

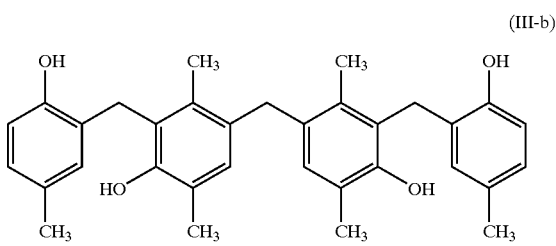

(III-b)

b3: An ester of 1 mole a compound represented by following Formula (I-b) with 3 moles of 1,2-naphthoquinonediazido-5-sulfonyl chloride (average esterification rate: 75%):

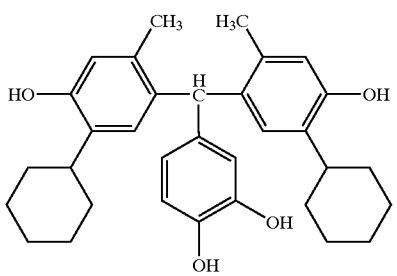

c1: A compound represented by the following formula:

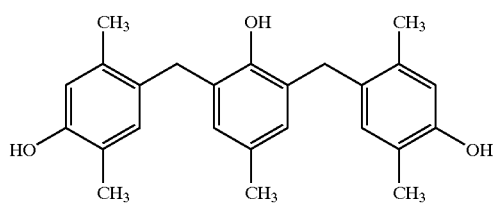

c2: A compound represented by the following formula:

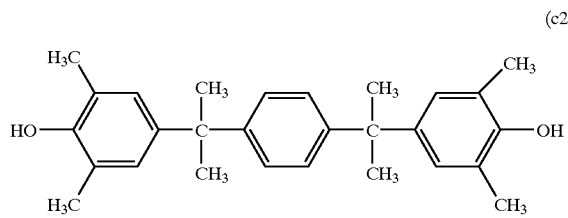

TABLE 2

| | Sensitivity (ms) | Definition | Profile | DOF (μm) |
|---|---|---|---|---|
| Example 1 | 900 | Good | Good | 0.8 |
| Example 2 | 850 | Good | Good | 0.8 |
| Example 3 | 900 | Good | Good | 0.8 |
| Example 4 | 800 | Fair | Good | 0.6 |
| Example 5 | 1050 | Fair | Good | 0.6 |
| Example 6 | 800 | Good | Good | 0.8 |
| Example 7 | 930 | Fair | Good | 0.6 |
| Example 8 | 870 | Good | Good | 0.6 |
| Com. Ex. 1 | 700 | Fair | Good | 0.4 |
| Com. Ex. 2 | 1200 | Poor | Poor | 0 |
| Com. Ex. 3 | — | — | — | — |

No separated pattern was obtained and no evaluation could be performed in Comparative Example 3.

FIG. 1 is a plan view showing hole patterns obtained according to Example 1 and Comparative Example 2, respectively. FIG. 1 shows that the positive photoresist composition of Example 1 can yield satisfactorily separated ultrafine patterns having a duty ratio of less than or equal to 1 within a wide DOF, as compared with the positive photoresist composition of Comparative Example 2.

Other embodiments and variations will be obvious to those skilled in the art, and this invention is not to be limited to the specific matters stated above.

What is claimed is:

1. A positive photoresist composition comprising:
   (A) an alkali-soluble novolak resin containing 1,2-naphthoquinonediazidosulfonyl groups substituting for part of hydrogen atoms of phenolic hydroxyl groups;
   (B) an ester of at least one selected from compounds represented by following Formula (I) with a naphthoquinonediazidosulfonyl compound; and
   (C) a sensitizer (intensifier):

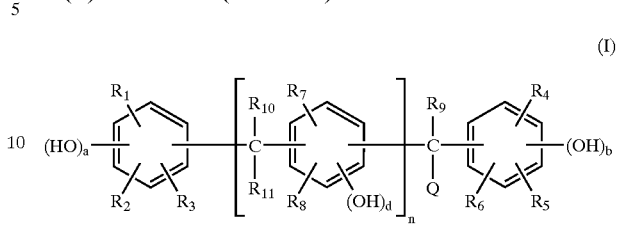

wherein $R^1$, $R^2$, $R^3$, $R^4$, $R^5$, $R^6$, $R^7$ and $R_8$ are each independently a hydrogen atom, a halogen atom, an alkyl group having from 1 to 6 carbon atoms, an alkoxyl group having from 1 to 6 carbon atoms or a cycloalkyl group; $R^9$, $R^{10}$ and $R^{11}$ are each independently a hydrogen atom or an alkyl group having from 1 to 6 carbon atoms; Q is a hydrogen atom or an alkyl group having from 1 to 6 carbon atoms, or Q is combined with $R^9$ to form a cycloalkyl ring having 3 to 6 carbon atom members or a residue represented by following Formula (II); a and b each independently denote an integer from 1 to 3; d denotes an integer from 0 to 3; and n denotes an integer from 0 to 3:

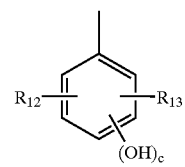

wherein $R^{12}$ and $R^{13}$ are each independently a hydrogen atom, a halogen atom, an alkyl group having from 1 to 6 carbon atoms, an alkoxyl group having from 1 to 6 carbon atoms or a cycloalkyl group; and c denotes an integer from 1 to 3;

wherein the ingredient (A) has a weight average molecular weight (Mw) in terms of polystyrene of from 4000 to 5000 and a molecular weight distribution (Mw/Mn) of less than or equal to 3.0, where Mn is a number average molecular weight.

2. The positive photoresist composition according to claim 1, wherein the ingredient (A) is an alkali-soluble novolak resin synthetically prepared from m-cresol, p-cresol and 2,3,5-trimethylphenol.

3. The positive photoresist composition according to claim 1, wherein the ingredient (B) is an ester of at least one selected from compounds represented by following Formula (III) and compounds represented by following Formula (IV) with a naphthoquinonediazidosulfonyl compound:

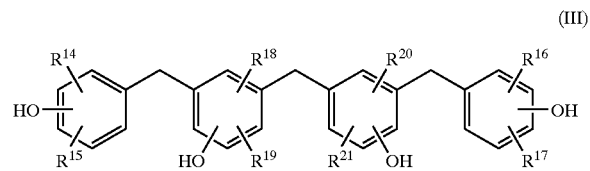

wherein $R^{14}$, $R^{15}$, $R^{16}$, $R^{17}$, $R^{18}$, $R^{19}$, $R^{20}$ and $R^{21}$ are each independently a hydrogen atom or an alkyl group having from 1 to 3 carbon atoms, and

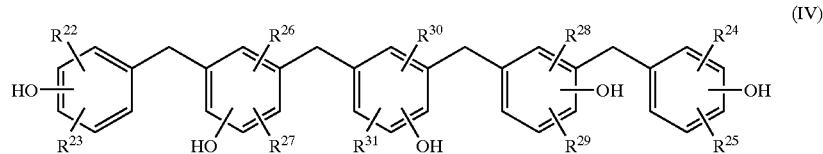
(IV)

wherein $R^{22}$, $R^{23}$, $R^{24}$, $R^{25}$, $R^{26}$, $R^{27}$, $R^{28}$, R29, $R^{30}$ and $R^{31}$ are each independently a hydrogen atom, an alkyl group having from 1 to 3 carbon atoms or a cyclohexyl group.

4. The positive photoresist composition according to claim 1, wherein the ingredient (C) is at least one selected from compounds represented by following Formula (V):

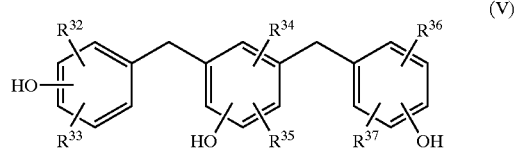
(V)

wherein $R^{32}$, $R^{33}$, $R^{34}$, $R^{35}$, $R^{36}$ and $R^{37}$ are each independently a hydrogen atom or an alkyl group having from 1 to 3 carbon atoms.

5. The positive photoresist composition according to claim 1, wherein the proportion of the ingredient (C) ranges from 1 to 40 parts by weight relative to 100 parts by weight of the ingredient (A).

6. The positive photoresist composition according to claim 1, wherein the proportion of the ingredient (B) ranges from 0.5 to 20 parts by weight relative to 100 parts by weight of the total weight of the ingredients (A) and (C).

* * * * *